(12) United States Patent
Bittner et al.

(10) Patent No.: US 12,025,818 B2
(45) Date of Patent: *Jul. 2, 2024

(54) OPTICAL ELEMENT HAVING A COATING FOR INFLUENCING HEATING RADIATION AND OPTICAL ARRANGEMENT (71) Applicant: Carl Zeiss SMT GmbH, Oberkochen (DE)

(72) Inventors: Boris Bittner, Roth (DE); Norbert Wabra, Werneck (DE); Holger Schmidt, Aalen (DE); Ricarda Schoemer, Zusmarshausen (DE); Sonja Schneider, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 492 days.

This patent is subject to a terminal disclaimer.

(21) Appl. No.: 17/393,551

(22) Filed: Aug. 4, 2021

(65) Prior Publication Data
US 2021/0364677 A1 Nov. 25, 2021

Related U.S. Application Data

(63) Continuation of application No. 16/550,655, filed on Aug. 26, 2019, now Pat. No. 11,112,543, which is a (Continued)

(30) Foreign Application Priority Data

Aug. 19, 2014 (DE) .................... 102014216458.3

(51) Int. Cl.
*G02B 5/08* (2006.01)
*G02B 5/30* (2006.01)
(Continued)

(52) U.S. Cl.
CPC ......... *G02B 5/0891* (2013.01); *G02B 5/0816* (2013.01); *G02B 5/3075* (2013.01);
(Continued)

(58) Field of Classification Search
CPC .. G02B 5/0891; G02B 5/0816; G02B 7/1815; H05G 2/00; G03F 7/70033;
(Continued)

(56) References Cited

U.S. PATENT DOCUMENTS 10,401,540 B2 * 9/2019 Bittner ................. G02B 5/3075
11,112,543 B2 * 9/2021 Bittner .................. G21K 1/062
(Continued)

FOREIGN PATENT DOCUMENTS

DE 102011078777 A1 * 10/2012 ............. G01N 29/07
DE 10 2011 086 513 A1 5/2013
(Continued)

OTHER PUBLICATIONS

International Search Report for corresponding PCT Appl No. PCT/EP2015/066340, dated Oct. 16, 2015.
(Continued)

*Primary Examiner* — Ryan D Howard
(74) *Attorney, Agent, or Firm* — Fish & Richardson P.C.

(57) ABSTRACT

The disclosure relates to an optical element, including: a substrate, a first coating, which is disposed on a first side of the substrate and is configured for reflecting radiation having a used wavelength ($\lambda_{EUV}$) in the EUV wavelength range, and a second coating, which is disposed on a second side of the substrate, for influencing heating radiation that is incident on the second side of the substrate. The disclosure also relates to an optical arrangement having at least one such optical element.

20 Claims, 3 Drawing Sheets

Related U.S. Application Data continuation of application No. 15/405,012, filed on Jan. 12, 2017, now Pat. No. 10,401,540, which is a continuation of application No. PCT/EP2015/066340, filed on Jul. 16, 2015.

(51) Int. Cl.
| | | |
|---|---|---|
| *G02B 7/18* | (2021.01) | |
| *G02B 27/00* | (2006.01) | |
| *G03F 7/00* | (2006.01) | |
| *G21K 1/06* | (2006.01) | |

(52) U.S. Cl.
CPC ....... *G02B 7/1815* (2013.01); *G02B 27/0025* (2013.01); *G03F 7/70266* (2013.01); *G03F 7/70891* (2013.01); *G03F 7/70958* (2013.01); *G21K 1/067* (2013.01)

(58) Field of Classification Search
CPC ............. G03F 7/70233; G03F 7/70891; G03F 7/70958; G21K 1/067
See application file for complete search history.

(56) References Cited

U.S. PATENT DOCUMENTS

| | | |
|---|---|---|
| 2002/0126400 A1 | 9/2002 | Muller-Rissmann et al. |
| 2003/0027053 A1 | 2/2003 | Yan |
| 2004/0131948 A1 | 7/2004 | Yan |
| 2005/0099611 A1 | 5/2005 | Sogard |
| 2005/0157284 A1 | 7/2005 | Moors et al. |
| 2008/0266651 A1 | 10/2008 | Murakami et al. |
| 2010/0290021 A1 | 11/2010 | Pazidis |
| 2011/0255167 A1 | 10/2011 | Merrill et al. |
| 2013/0077074 A1 | 3/2013 | Major et al. |
| 2013/0141707 A1 | 6/2013 | Baer et al. |
| 2014/0055765 A1 | 2/2014 | Nakayama et al. |
| 2014/0363633 A1 | 12/2014 | Kim |
| 2016/0377988 A1 | 12/2016 | Paul et al. |
| 2017/0123118 A1 | 5/2017 | Bittner et al. |
| 2019/0377107 A1 | 12/2019 | Bittner |

FOREIGN PATENT DOCUMENTS

| | | |
|---|---|---|
| DE | 10 2014 204 171 A1 | 9/2015 |
| JP | 2001196304 A | 7/2001 |
| JP | 2005004145 A | 1/2005 |
| JP | 2005019628 A | 1/2005 |
| JP | 2006177740 A | 7/2006 |
| JP | 2008270739 A | 11/2008 |
| JP | 2008288299 A | 11/2008 |
| JP | 2013533633 A | 8/2013 |
| JP | 2014041880 A | 3/2014 |
| JP | 2017510842 A | 4/2017 |
| WO | WO 2009/046955 | 4/2009 |
| WO | WO 2009/152959 A1 | 12/2009 |
| WO | WO 2012/013747 A1 | 2/2012 |
| WO | WO 2013/044936 A1 | 4/2013 |
| WO | WO 2014/139543 | 9/2014 |
| WO | WO 2015/132198 | 9/2015 |

OTHER PUBLICATIONS

International Preliminary Report on Patentability for corresponding PCT Appl No. PCT/EP2015/066340, dated Feb. 21, 2107.
Japanese Office Action for App. Ser. No. JP 2017-509648, dated Jan. 30, 2018 (English translation), 15 pages.

\* cited by examiner

OPTICAL ELEMENT HAVING A COATING FOR INFLUENCING HEATING RADIATION AND OPTICAL ARRANGEMENT

CROSS-REFERENCE TO RELATED APPLICATIONS

The present application is a continuation of, and claims benefit under 35 USC 120 to, U.S. application Ser. No. 16/550,655, filed Aug. 26, 2019, which is a continuation of, and claims benefit under 35 USC 120 to, U.S. application Ser. No. 15/405,012, filed Jan. 12, 2017, now U.S. Pat. No. 10,401,540, which is a continuation of, and claims benefit under 35 USC 120 to, international application PCT/EP2015/066340, filed Jul. 16, 2015, which claims benefit under 35 USC 119 of German Application No. 10 2014 216 458.3, filed Aug. 19, 2014. The entire disclosures of U.S. application Ser. Nos. 16/550,655, 15/405,012, international application PCT/EP2015/066340 and German Application No. 10 2014 216 458.3 are incorporated by reference herein.

FIELD

The disclosure relates to an optical element and to an optical arrangement having at least one such optical element.

BACKGROUND

Due to the high absorption of radiation at used wavelengths in the EUV wavelength range between approximately 1 nm and approximately 35 nm, no refractive optics, such as for example lens elements, but rather mirror elements are typically used as optical elements for this wavelength range. Such optical elements which reflect EUV radiation absorb a portion of the EUV radiation, which is incident on the optical surface during operation, and expand in the process. Due to the absorption, or the associated expansion, deformations occur on the optical surface of these mirror elements, which result in undesired optical aberrations.

WO 2012/013747 A1 discloses controlling the location-dependent temperature distribution in a substrate of a reflective optical element using a temperature control device in two or three spatial directions to correct aberrations. The temperature control device can have heating elements, for example in the form of resistance heating elements which can be arranged in a grid. It is also possible for radiation sources which act on the substrate or on the reflective optical element by way of thermal radiation (for example IR radiation) so as to thermally influence it to be provided as heating elements. An absorption layer serving for absorption of the IR radiation can here be arranged below a reflective surface of the optical element. In order to produce a temperature distribution in the substrate which is as homogeneous as possible, it is possible for the radiation sources to be configured for supplying thermal radiation onto the front side of the substrate at which the EUV radiation is reflected, or for supplying thermal radiation to the rear side of the substrate.

WO 2009/152959 A1 discloses a projection exposure apparatus for semiconductor lithography, having a device for thermally manipulating an optical element which has a front side for reflecting electromagnetic radiation and a rear side. Provided are thermal actuators what act on the optical element from the rear side. The thermal actuators can be LEDs or lasers, the emission spectrum of which can be in the IR wavelength range. Such thermal actuators can emit electromagnetic radiation which at least partially passes through the substrate and which is at least partially absorbed by an absorption layer which is disposed on the front side of the substrate on which a multi-layer coating is also applied. A coating exhibiting high absorption for radiation emitted by the actuators can also be applied on the rear side of a plane mirror. A substrate which is transparent for radiation at the used wavelength can be disposed on the front side of the plane mirror.

For the purposes of heat dissipation, optical elements reflecting EUV radiation are typically cooled from the rear side and/or from the peripheral surfaces. Due to issues relating to installation space, the heat sinks used for this purpose frequently cannot be designed in an ideal fashion and generate a non-constant, location-dependently varying temperature distribution on the rear side of such an optical element. In principle, it is possible, with sufficient installation space, for the temperature distribution in a substrate to be appropriately set or thermally homogenized tomographically in all three spatial directions.

For example, it is known from WO 2013/044936 A1 to arrange a wavefront correction apparatus having a refractive optical element in a microlithographic projection lens. A first and second partial region of a circumferential peripheral surface of the refractive optical element can be respectively irradiated with first and second thermal radiation which at least partially penetrates the optical element. A refractive index distribution within the optical element, caused by the partial absorption of the thermal radiation, serves for changing, or at least partially correcting, a wavefront error.

PCT/EP2013/000728 discloses the arrangement of a wavefront correction apparatus in the form of a mirror having a reflective coating and a mirror substrate in a projection lens. A first and second partial region of a circumferential peripheral surface of the mirror substrate can be respectively irradiated with first and second thermal radiation which at least partially penetrates the mirror substrate. A temperature distribution in the substrate, caused by the partial absorption of the thermal radiation, results in a deformation of the mirror which serves for changing, or at least partially correcting, a wavefront error.

In order to neutralize the thermal profile caused by the heat sink or to homogenize the temperature distribution in the substrate, additional heating from the front side of the substrate, for example using a radiation source or using the resistance heating elements which were described further above, can be effected in principle. However, a coating reflecting EUV radiation, which is disposed on the front side of the substrate, could be damaged by the additional introduction of heat and that hysteresis can occur, for example, if the thermal profile on the rear side of the substrate is intended to be set or regulated by the action on the front side of the substrate.

SUMMARY

The disclosure seeks to provide an optical element and an optical arrangement which allow simplified influencing of the temperature distribution in the optical element.

In one general aspect, the disclosure provides an optical element that includes: a substrate, a first coating, which is disposed on a first side of the substrate and is configured for reflecting radiation having a used wavelength in the EUV wavelength range, and a second coating, which is disposed on a second side of the substrate, for influencing heating radiation that is incident on the second side of the substrate.

In an optical element according to the disclosure, a second coating is disposed on the second side of the substrate, i.e. the side on which typically a heat sink, which is spaced apart from the substrate, is arranged, which second coating serves for influencing heating radiation that is incident on the second side of the substrate. The second coating can serve in particular for generating a targeted heat introduction of the heating radiation in the proximity of the second side of the substrate, in the proximity of the first side of the substrate, and/or in the volume of the substrate.

The coating disposed on the first side typically has an EUV coating or consists of an EUV coating. Such an EUV coating typically has a high reflectance (HR) coating for the used wavelength in the EUV wavelength range. A further coating can be arranged between the HR coating and the substrate in order to protect the substrate against damaging EUV radiation (what is known as an SPL ("substrate protection layer") coating) and/or in order to prevent undesired deformation of the optical element (what is known as an ASL ("anti stress layer") coating). Additionally, a cover layer or a cover layer system (what is known as a cap coating) can also be applied on the reflective coating, which cover layer is intended to protect the entire EUV coating against oxidation or corrosion.

In one embodiment, the second coating has at least one absorbing layer which absorbs heating radiation at a first heating wavelength which differs from the used wavelength and is greater than the used wavelength. Typical heating wavelengths are generally in a wavelength range above approximately 193 nm, in particular in the visible wavelength range or in the IR wavelength range, for example at more than 1.5 µm, in particular in a wavelength range between 2000 nm and 2100 nm or between 2300 nm and 2500 nm. The heating radiation is received by the absorbing layer and generates a heat introduction within the absorbing layer or within the substrate in the region of the second side, which serves for homogenizing the thermal profile of the substrate.

Homogenizing the thermal profile or the temperature gradient in the thickness direction of the substrate can be supported in particular by additional generation of heat introduction in the region of the first side of the substrate. The heat introduction on the first side can be generated, for example, by heating elements, for example by resistance heating elements, which are disposed or positioned on the first side on the substrate, and/or by radiating additional heating radiation onto the first side of the substrate using one or more heating light sources. The heating wavelength of the additional heating radiation can match the first heating wavelength or differ therefrom.

In one development, the at least one absorbing layer is disposed between the substrate and at least one anti-reflection layer for suppressing the reflection of the heating radiation at the first heating wavelength. In particular, the at least one absorbing layer can be disposed between the substrate and a plurality of anti-reflection layers which together form an anti-reflection coating.

The anti-reflection layer or the anti-reflection coating serves for reducing the reflectance of the heating radiation at the first heating wavelength that is incident on the second side of the substrate or on the absorbing layer and for thus avoiding that a not insignificant portion of the incident heating radiation is reflected. The reflected heating radiation can otherwise be incident directly or indirectly, that is to say via further, strongly reflecting components, for example heat sinks, on other optical elements, for example mirrors or—in the case of a projection exposure apparatus—on the wafer and result here in parasitic undesired heating up.

Within the meaning of this application, an anti-reflection layer or an anti-reflection coating is understood to mean a layer or a coating which achieves a decrease in the reflectance by way of destructive interference of the reflected heating radiation. That means that the layer materials and the layer thicknesses of the layers of the anti-reflection coating are selected such that destructive interference occurs for the heating radiation, which is incident on the anti-reflection coating, at the respective heating wavelength. The properties of the layer materials which are relevant for destructive interference are the (wavelength-dependent) refractive index n and the (wavelength-dependent) extinction coefficient k, which together form the complex refractive index $\bar{n}=n-ik$ of a respective layer material.

In order to produce the destructive interference, the anti-reflection coating can have a multiplicity of individual layers. In this case, the layer construction of the anti-reflection coating is preferably periodic or partially periodic. However, the anti-reflection coating can also have just a single anti-reflection layer, the layer thickness and layer properties of which (complex refractive index) are matched to the properties of the absorbing layer such that the anti-reflection layer has an anti-reflective effect for the heating radiation at the heating wavelength.

In one development, an absorptance of the at least one absorbing layer and/or the suppression of the reflection by the at least one anti-reflection layer for heating radiation at the first heating wavelength has a maximum at wavelengths of more than 1500 nm. The layer materials of the at least one absorbing layer and/or of the at least one anti-reflection layer are in this case optimized for heating radiation at a heating wavelength in the above-stated heating wavelength range.

In one further embodiment, the at least one layer absorbing the heating radiation at the first heating wavelength is configured for transmitting heating radiation at a second heating wavelength which differs from the first one. The further layers provided in the second coating are also typically transparent for the heating radiation at the second wavelength, with the result that heating radiation having the second heating wavelength that is incident on the second side of the substrate can penetrate the substrate practically without hindrance. The material of the substrate is typically transparent for heating radiation at the second heating wavelength, with the result that the latter passes through the substrate nearly without absorption and is incident on the first coating. The first coating in this case is typically configured to absorb the heating radiation at the second heating wavelength, with the result that the heat introduction is effected in the proximity of the optical surface of the optical element at which the EUV radiation at the used wavelength is reflected. In this way it is possible, if appropriate, to dispense with the irradiation of the first side of the substrate with additional heating radiation.

The substrate material can be, for example, quartz glass ($SiO_2$). However, in EUV mirrors typically what are known as zero-expansion materials are used as substrate materials, that is to say materials which have only a very low coefficient of thermal expansion (CTE) in the range of the operating temperatures which are used there. Such a mirror material is synthetic, amorphous quartz glass which has a small proportion of titanium doping. Such a commercially available silicate glass is sold by Corning Inc. under the trade name ULE® (Ultra Low Expansion glass). For heating wavelengths between approximately 193 nm and approximately 2300 nm, the mirror material ULE® exhibits low absorption. As an alternative to the use of a doped quartz glass, specifically a TiO$_2$-doped quartz glass, it is also possible to use a glass ceramic as the zero-crossing material. Such a glass ceramic is, for example, ZERODUR® from SCHOTT.

In one further embodiment, a transmittance of the at least one absorbing layer for heating radiation at the second heating wavelength has a maximum at wavelengths of less than 1500 nm. Heating radiation having a second heating wavelength in this wavelength range can pass through the layer almost without loss. The material of the absorbing layer can be, for example, germanium (Ge), which has an absorption edge at a comparatively large wavelength of approximately 1.5 μm.

In one alternative embodiment, the second coating has at least one layer which transmits heating radiation at a first heating wavelength and heating radiation at a second heating wavelength which differs from the first one. The heating radiation at the second heating wavelength can be, as described above, within a wavelength range which is transmitted by the substrate to generate heat introduction in the region of the first coating. The first heating wavelength can be selected such that it is strongly absorbed by the substrate material, with the result that the heat introduction of the heating radiation at the first wavelength is effected substantially in the proximity of the second coating.

In one development, the substrate is formed from a material which at least partially absorbs heating radiation at the first heating wavelength. By way of example, the substrate material can be ULE®. In this case, the first heating wavelength is typically less than 200 nm or more than approximately 3700 nm. In other substrate materials, for example glass ceramics such as Zerodur®, the wavelength range at which the heating radiation is absorbed deviates from the wavelength range stated above for ULE®.

In one development, the at least one transmitting layer is disposed between the substrate and at least one anti-reflection layer for suppressing the reflection of the heating radiation at the first heating wavelength and the second heating wavelength. As described further above, the anti-reflection layer or the anti-reflection coating prevents the reflection of heating radiation which could otherwise result in undesired heat introduction in other components.

In one further embodiment, the first coating has at least one reflective layer which is configured to reflect heating radiation at a third heating wavelength. This embodiment can be implemented in combination with the above-described embodiments, that is to say using heating radiation at a first and/or second heating wavelength, wherein in this case, the third heating wavelength typically differs from the first and/or second heating wavelength. However, this embodiment can also be implemented without using heating radiation at the first heating wavelength and the second heating wavelength, that is to say only heating radiation having the third heating wavelength is incident on the second side of the substrate. The reflective layer can be an additional layer which is introduced into the first coating only for the purposes of reflecting the heating radiation. If appropriate, the reflective layer or the plurality of reflective layers which together form a coating that reflects heating radiation can be part of an EUV coating which is applied on the first side of the substrate in any case. The latter may be the case in particular if the EUV coating has an SPL coating or an ASL coating.

In this embodiment, the third heating wavelength is typically selected such that it is absorbed weakly or with medium strength by the substrate material. Using ULE® as a substrate material, third heating wavelengths at which the heating radiation is weakly absorbed are between, for example, approximately 400 nm and approximately 2300 nm. Medium-strong absorption of the heating radiation takes place at heating wavelengths of between approximately 3500 nm and approximately 3700 nm in dependence on the thickness of the mirror main body (of the substrate). The preferred wavelength here depends on the absorption capacity of the substrate for the heating radiation and thus on the thickness of the substrate.

In one further embodiment, the second coating has at least one anti-reflection layer for suppressing the reflection of heating radiation at the third heating wavelength. As was described further above, if a suitable anti-reflection coating which is optimized for the third heating wavelength is selected, reflection of heating radiation at the second side of the optical element, which could otherwise lead to undesired heat introduction into other components, can be avoided or greatly attenuated.

In one development, the reflectance of the heating radiation having the third heating wavelength at the at least one reflective layer and/or the suppression of the reflection of the heating radiation by the at least one anti-reflection layer for the third heating wavelength has a maximum in a wavelength range between 3500 nm and 3700 nm, preferably between 3550 nm and 3650 nm. The at least one reflective layer or the at least one anti-reflection layer are optimized for heating radiation which is in the above-stated wavelength range. If the at least one reflective layer is an SPL coating or an ASL coating, the layer materials or layer thicknesses thereof can also be selected such that they are optimized for the reflection of heating radiation in the above-stated wavelength range.

In this embodiment, it is typically advantageous if the heating radiation at the third wavelength is absorbed with medium strength by the substrate material such that the radiation proportion which is reflected at the reflective layer back into the substrate volume is completely absorbed before it can exit the substrate on the second side.

In one alternative embodiment, the second coating has a polarization-selective layer which is configured for the transmission of heating radiation at the third wavelength in a first (typically linear) polarization state and for the reflection of heating radiation at the third wavelength in a second (typically linear) polarization state which differs from the first one. In this embodiment, the heating radiation is incident on the second side of the substrate at an angle (different from zero) with respect to the surface normal. The heating radiation is typically linearly polarized heating radiation, as is generated, for example, by heating light sources in the form of lasers or possibly using polarization filters.

In this embodiment, the heating radiation generated by the heating light source is typically incident in the first polarization state (i.e. linearly polarized) on the polarization-selective layer and is transmitted thereby, as a result of which only a small proportion of the incident heating radiation is reflected due to the suppression of the reflection or the utilization of the polarization-selective layer as an anti-reflection layer. The transmitted heating radiation passes through the substrate and is reflected at the reflective layer of the first coating in the direction back to the second side of the substrate and is incident again on the polarization-selective layer. In order to ensure that the heating radiation is reflected at the polarization-selective layer back into the substrate volume, the heating radiation is converted from the first polarization state into the second polarization state, which is typically likewise linear, on its way through the substrate volume.

In one development, the optical element additionally has at least one polarization-changing layer which is disposed at the first coating between the reflective layer and the substrate or at the second coating between the polarization-selective layer and the substrate. The heating radiation typically passes twice through the polarization-changing layer, which in the process rotates the polarization direction of the heating radiation by 90°, with the result that p-polarized heating radiation is generated from s-polarized heating radiation, or vice versa. If appropriate, a polarization-changing layer can be provided both on the first coating and on the second coating, which both cause a change of the polarization state in each case (retardation), which in sum effects a rotation of the polarization direction by 90°.

In one development, the second coating is configured for the transmission of heating radiation at the third heating wavelength, but, if appropriate, only in the first polarization state (see above). The anti-reflection layer, the polarization-selective layer and also the polarization-changing layer, if present, transmit heating radiation at the third heating wavelength which is incident on the substrate from the second side. If the embodiment which was just described is combined with the embodiments which were described further above, in which heating radiation is generated at the first or the second heating wavelength, care is taken that the second coating transmits the heating radiation at the third heating wavelength. In particular, the first, the second and the third heating wavelength should be selected such that they differ.

In one embodiment, the substrate is formed from a material which is at least partially transparent for the heating radiation at the second and/or the third wavelength. The substrate material can be, for example, ULE®, which is, as described further above, substantially transparent for wavelengths of between approximately 400 nm and approximately 2300 nm. In particular in the embodiment which is described further above, in which polarized heating radiation is used, the substrate is transparent for the third heating wavelength.

In one further embodiment, the optical element is configured in the form of an EUV mirror or in the form of an EUV mask. An EUV mirror serves for reflecting EUV radiation typically over its entire surface. An EUV mask has partial regions which reflect EUV radiation and (typically absorbing) partial regions which do not reflect or only somewhat reflect EUV radiation, which together form a structure which is illuminated with EUV radiation by an illumination unit and is imaged on a wafer using a projection lens. The reflected structures should reflect the highest possible proportion of the EUV radiation and can be formed by an EUV coating or HR coating.

One further aspect of the disclosure relates to an optical arrangement, including at least one optical element as described above, and at least one device for thermally influencing the optical element, which device has at least one, preferably a plurality of heating light sources for generating heating radiation at at least one heating wavelength, wherein the device is configured to irradiate the second side of the substrate of the optical element with heating radiation.

For this purpose, the heating radiation is typically guided into an intermediate space between a heat sink and the second side of the substrate or is generated in the region of the intermediate space, i.e. the heating light sources are arranged there. The optical arrangement containing the at least one optical element can be, for example, a projection optics for an EUV lithography apparatus, a system for inspecting EUV masks, or an EUV lithography apparatus.

In order to effect targeted local heat introduction into the optical element, the device typically has a plurality of heating light sources which direct heating radiation to respectively different locations at the second side of the substrate. In order to influence the local heat introduction in a targeted fashion and to effect in this way homogenization of the thermal profile of the optical element or of the substrate, the device for thermal influencing is configured to set or regulate the radiation output of the heating light sources independently of one another.

In one embodiment, the device for thermal influencing has a plurality of heating light sources in a grid-type or matrix-type arrangement. The grid-type arrangement having equidistantly arranged heating light sources allows thermal influencing of the optical element with a desired spatial resolution to be effected. A suitable optics for beam shaping can be connected upstream of each of the light sources. If heating radiation at two or more heating wavelengths is used, two or more arrangements of heating light sources can be provided, if appropriate, in the device, which are configured in each case for generating heating radiation having a respective heating wavelength.

For the input coupling of the heating radiation, a plurality of heating light sources, for example in the form of heating diodes, can be mounted typically in a grid-type arrangement at the side of the heat sink which faces the substrate. However, it is also possible to arrange the heating light sources at a distance from the heat sink and for the heating radiation to be guided into the intermediate space between the heat sink and the second side of the optical element using beam guiding devices, for example in the form of fibre-optic cables and to be directed here, for example using deflection elements, for example deflection prisms or mirrors, to the second side of the substrate.

In one embodiment, the optical arrangement is configured in the form of an EUV lithography apparatus. The thermally influenceable optical element can be, for example, an EUV mirror which is arranged in an illumination unit or in a projection lens of the EUV lithography apparatus, but can also be an EUV mask.

Further features and advantages of the disclosure emerge from the following description of exemplary embodiments of the disclosure, on the basis of the figures in the drawing, which show details of the disclosure, and from the claims. The individual features can be realized respectively on their own or together in any combination in one variant of the disclosure.

BRIEF DESCRIPTION OF THE DRAWINGS

Exemplary embodiments are illustrated in the schematic drawing and are explained in the following description, in which.

DETAILED DESCRIPTION OF EXEMPLARY EMBODIMENTS

Identical reference signs are used in the following description of the drawings for components that are the same or functionally the same.

Figure 1:
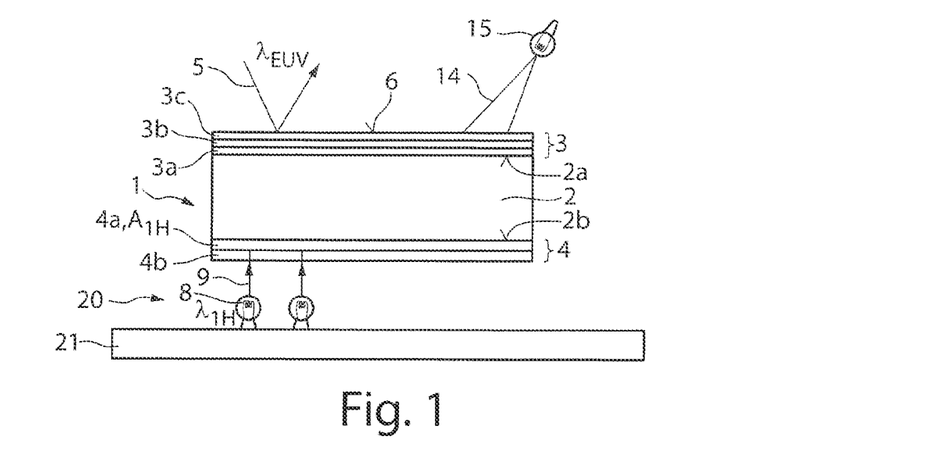
FIG. 1 shows a schematic illustration of an optical element in the form of an EUV mirror and a device for thermally influencing the EUV mirror, in which heating radiation is absorbed at an absorbing layer of a coating which is disposed on the bottom side of the EUV mirror.

FIG. 1 schematically shows an optical element 1 in the form of an EUV mirror which has a substrate 2 made of ULE®, a first coating 3, applied on a first side (upper side) 2a of the substrate 2, in the form of an EUV coating, and a second coating 4, applied on a second side (bottom side) 2b of the substrate 2 which is located opposite the first side.

The EUV coating 3 has a coating 3b (what is known as an HR coating) which reflects EUV radiation 5 at a used wavelength $\lambda_{EUV}$. Applied on the reflective coating 3b is additionally a cover layer or a cover layer system (what is known as a cap coating 3c), which is intended to protect the entire EUV coating 3 against oxidation or corrosion, for example if the EUV mirror 1 is cleaned by way of a hydrogen plasma. The cap coating 3c is arranged adjacently to an optical surface 6 of the EUV mirror 1, which forms the boundary surface of the EUV mirror 1 with the environment.

The reflective coating 3b has a plurality of individual layers (not illustrated in FIG. 1), which typically consist of layer pairs of two materials having different refractive indices. If EUV radiation 5 at a used wavelength in the range of $\lambda_{EUV}$=13.5 nm is used, the individual layers are typically made of molybdenum and silicon. In dependence on the used wavelength $\lambda_{EUV}$, other material combinations such as for example molybdenum and beryllium, ruthenium and beryllium, or lanthanum and $B_4C$ are likewise possible. In addition to the individual layers, the reflective coating 3b typically has intermediate layers to prevent diffusion (what are known as barrier layers).

The EUV coating 3 of FIG. 1 has, below the reflective coating 3b, what is known as an SPL (substrate protection layer) coating 3a to protect the substrate 2 against damaging EUV radiation 5. In addition or alternatively to an SPL coating 3a, what is known as an ASL (anti-stress layer) coating can also be provided below the reflective coating 3b on the EUV mirror 1 in order to avoid undesired deformations due to layer stresses.

FIG. 1 likewise shows a device 20 for thermally influencing the EUV mirror 1, having a plurality of heating light sources 8, two of which are illustrated by way of example in FIG. 1, which can be attached to a heat sink 21. The heating light sources 8 are configured for generating heating radiation 9 at a first heating wavelength $\lambda_{1H}$, with which the second side 2b of the substrate 2, more specifically the second coating 4, is irradiated.

The second coating 4 has an absorbing layer 4a, which is applied in the example shown directly to the bottom side 2b of the substrate 2 and which has absorbing properties for the heating radiation 9 at the first heating wavelength $\lambda_{1H}$. The material of the absorbing layer 4a can be, for example, a layer of germanium (Ge). Germanium is sufficiently transparent up to a wavelength of approximately 1.5 µm, in particular between 400 nm and 1000 nm. An anti-reflection layer 4b which serves for suppressing the reflection of the heating radiation 9 at the first heating wavelength $\lambda_{1H}$ is applied onto the absorbing layer 4a. The anti-reflection layer 4b can be, for example, a multilayer coating or a layer stack, for example the following layer stack: (1Si 4.981$Si_3N_4$)^5. Details relating to this layer stack can be gathered from the patent application DE 102014204171.6, which is incorporated in the content of this application with respect to this aspect.

In the shown example, the first heating wavelength km is within the IR range at approximately 2000 nm, with typical values for the first heating wavelength $\lambda_{1H}$ being between approximately 2000 nm and 2100 nm or between 2300 nm and 2500 nm. The material of the absorbing layer 4a is selected such that the absorptance has a maximum in the above-stated wavelength range of more than 1.5 µm. However, since materials exist which have strongly absorbing properties for electromagnetic radiation over a wide wavelength range, it is not absolutely necessary for the absorbing layer 4a to have a maximum of its absorbance Aix within the above-stated wavelength range.

The material of the anti-reflection layer 4b and the layer thickness thereof are selected such that an anti-reflective effect sets in within the above-stated wavelength range, i.e. for the anti-reflection layer 4b, the suppression of the reflection $R_{1H}$ of the heating radiation 9 is at a maximum at the first heating wavelength $\lambda_{1H}$. In place of an individual anti-reflection layer 4b, an anti-reflection coating can also be formed on the second coating 4, i.e. a plurality of anti-reflection layers 4b which together have an anti-reflective effect.

The heating radiation 9 serves for thermally influencing the EUV mirror 1, more specifically for generating a targeted location-dependent heat introduction into the absorbing layer 4a in order to produce a desired temperature profile in the proximity of the bottom side 2b of the substrate 2 or within the substrate volume which adjoins it. The desired temperature profile typically corresponds to a thermal profile which runs counter to the thermal profile produced in the region of the bottom side 2b of the substrate 2 due to the presence of the heat sink 21, with the result that, in the ideal case, in total, a temperature is established in the substrate 2 which is constant over the entire bottom side 2b.

Accordingly, homogenization of the temperature distribution can also be effected at the upper side 2a of the substrate 2 by irradiating the upper side 2a of the substrate 2 with additional heating radiation 14 which is typically generated by a plurality of further heating light sources 15. In the example shown, the heating wavelength $\lambda_{1H}$ of the further heating light sources 15 corresponds to the first heating wavelength $\lambda_{1H}$, although this is not absolutely necessary.

During operation, EUV radiation 5 is incident on the EUV mirror 1, the intensity distribution of which varies in a location-dependent manner over the optical surface 6 and is generally not constant over time. The intensity distribution of the EUV radiation 5 which varies in a location-dependent manner results in a locally differing heat introduction at the upper side 2a of the EUV mirror 1, and thus in a temperature distribution which is not spatially or temporally constant. The further heating radiation 14 serves for counter-heating, that is to say those regions in which the substrate 2 or the EUV coating 3 has a comparatively low temperature are additionally heated to homogenize the temperature distribution and to obtain, in the ideal case, a constant temperature on the optical surface 6 overall.

Figure 2A:
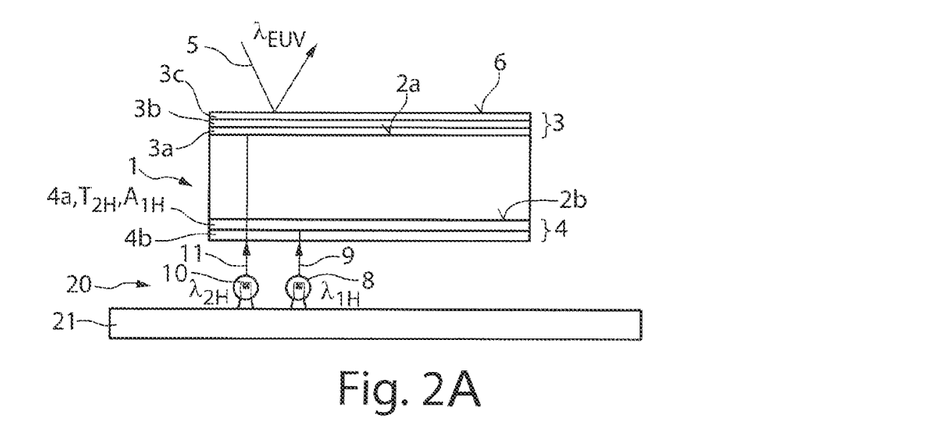
FIG. 2A shows an illustration similar to FIG. 1, in which heating radiation at a first heating wavelength is absorbed at the coating, and heating radiation at a second heating wavelength is transmitted by the coating.

In the example illustrated in FIG. 2A, and in contrast with FIG. 1, the upper side 2a of the substrate 2 is heated from the bottom side 2b of the substrate 2, i.e. through the substrate 2. For this purpose, a second heating light source 10 is arranged on the heat sink 21, which generates heating radiation 11 at a second heating wavelength $\lambda_{2H}$, which in the illustrated example is approximately 400 nm, with typical values being between approximately 400 nm and approximately 1500 nm.

The second coating 4, more specifically the layer 4a which absorbs the heating radiation 9 at the first heating wavelength $\lambda_{1H}$, is transparent for the second heating wavelength $\lambda_{2H}$. The heating radiation 11 at the second heating wavelength $\lambda_{2H}$ is transmitted by the substrate 2 and absorbed at the EUV coating 3. If the absorption by the EUV coating 3 is not sufficient, an additional absorbing layer or coating, for example a metallic layer, can be provided, if appropriate, on the side thereof which faces the substrate 2.

In the ideal case, the anti-reflection layer 4b is configured such that the suppression of the reflection is maximum both for heating radiation 9 of the first heating wavelength $\lambda_{1H}$ and for heating radiation 11 of the second heating wavelength $\lambda_{2H}$. If appropriate, the layer 4a, which transmits both the heating radiation 11 at the second heating wavelength $\lambda_{2H}$, can also serve as an anti-reflection layer for the second heating wavelength $\lambda_{2H}$ and possibly for the first heating wavelength $\lambda_{1H}$, such that the provision of an additional anti-reflection layer can be dispensed with.

Figure 2B:
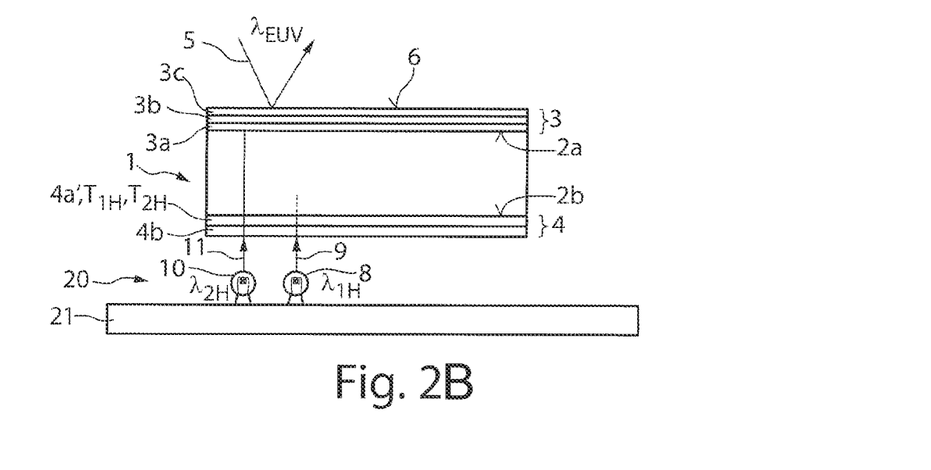
FIG. 2B shows an illustration similar to FIG. 1, in which heating radiation at a first heating wavelength is absorbed within the volume of a mirror substrate, and heating radiation at a second heating wavelength is transmitted by the coating.

In one alternative exemplary embodiment illustrated in FIG. 2B, the second coating 4 has a layer 4a' which transmits both heating radiation 9 at the first heating wavelength $\lambda_{1H}$ and also heating radiation 11 at the second heating wavelength $\lambda_{2H}$. The transmissive layer 4a' in the example shown is made of germanium (Ge) and has a high transmittance $T_{1H}$, $T_{2H}$ for both heating wavelengths $\lambda_{1H}$, $\lambda_{2H}$. The heating radiation 11 at the second heating wavelength $\lambda_{2H}$, which is generated by the second heating light source 10, passes through the substrate 2, as in FIG. 2A, and is absorbed at the EUV coating 3, more specifically at the SPL coating 3c, in order to produce heat introduction here. The heating radiation 9 at the first heating wavelength $\lambda_{1H}$, which is generated by the first heating light source 8 and is in the IR range, is strongly absorbed within the volume of the substrate 2 made of ULE® and therefore produces a heat introduction in the proximity of the bottom side 2b of the substrate 2.

The second coating 4 has an anti-reflection coating or an anti-reflection layer 4b, which serves both for suppressing the reflection of the heating radiation 9 at the first heating wavelength $\lambda_{1H}$ and for suppressing the reflection of the heating radiation 11 at the second heating wavelength $\lambda_{2H}$. If appropriate, it is also possible to dispense with the provision of the transparent layer 4a'. The second heating wavelength $\lambda_{2H}$ can be selected to be between approximately 2650 nm and approximately 2800 nm, or between approximately 4000 nm and approximately 10 000 nm, in particular between 4500 nm and 5500 nm. According to the preceding example, the first heating wavelength $\lambda_{1H}$ can be between approximately 2000 nm and approximately 2100 nm, and between approximately 2300 nm and approximately 2500 nm.

Figure 3A:
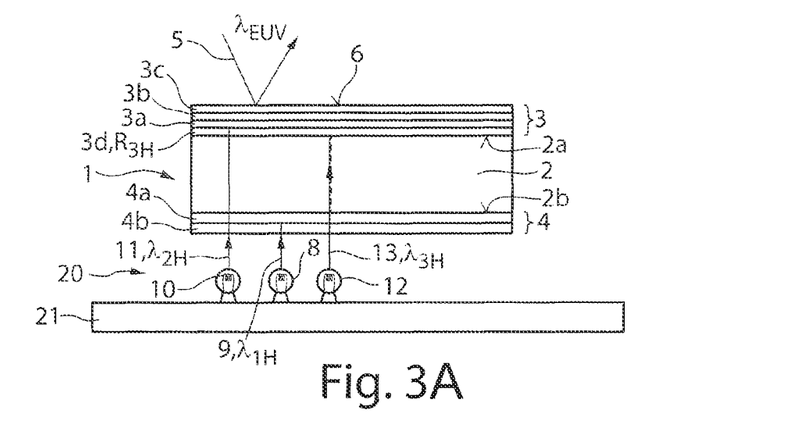
FIGS. 3A-3C show schematic illustrations similar to FIG. 2A, in which heating radiation at a third heating wavelength is reflected by a reflective layer of a coating which is disposed on the front side of the EUV mirror.
Figure 3B:
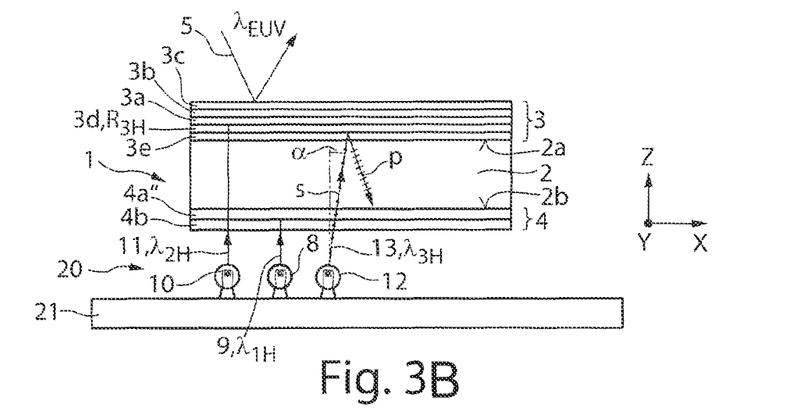
Figure 3C:
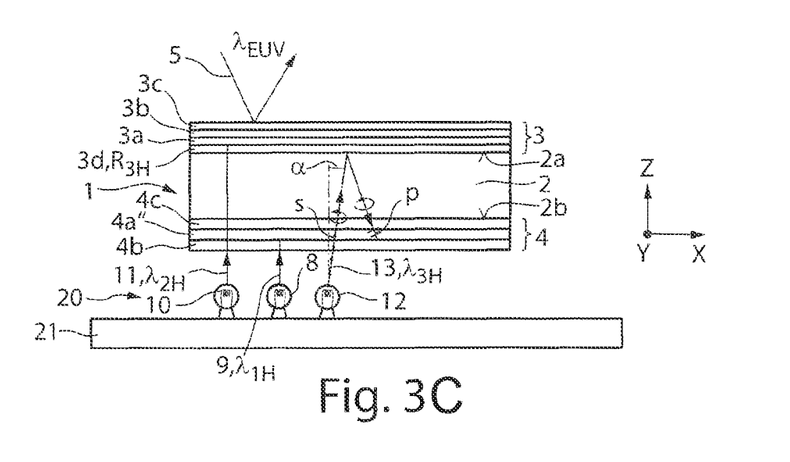

FIGS. 3A-3C show examples of EUV mirrors 1, in which the EUV coating 3 has an additional, bottommost layer 3d, which is configured for reflecting heating radiation 13 at a third heating wavelength $\lambda_{3H}$, which is generated by a third heating light source 12. In place of an additional reflective layer 3d, as is shown in FIGS. 3A-3C, it is also possible, if appropriate, for the SPL coating 3a to serve as the layer which reflects heating radiation 13 at the third heating wavelength $\lambda_{3H}$, with the result that the additional reflective layer 3d can be dispensed with. The heating radiation 13 at the third heating wavelength $\lambda_{3H}$ serves for generating heat introduction within the volume of the substrate 2, which likewise serves for homogenizing the temperature distribution.

FIG. 3A shows an example of an EUV mirror 1, in which the heating radiation 9 at the first heating wavelength $\lambda_{1H}$ and the heating radiation 11 at the second heating wavelength $\lambda_{2H}$ are supplied analogously to FIG. 2A. In addition, heating radiation 13, which has a third heating wavelength $\lambda_{3H}$ and is generated by a third heating light source 12, is transmitted by the second coating 4, passes through the substrate 2, is incident on the reflective layer 3d, and is reflected at the latter back into the substrate 2. The absorptance of the ULE® material of the substrate 2 with respect to the heating radiation 13 at the third heating wavelength $\lambda_{3H}$ in this case is medium strong, such that the heating radiation 13, which is reflected at the reflective layer 3d, does not propagate all the way to the bottom side 2b of the substrate 2 and cannot exit at the bottom side 2b.

In the example shown in FIG. 3A, in which the heating radiation 13 is absorbed by the substrate 2 with medium strength, the third heating wavelength $\lambda_{3H}$ is approximately 3600 nm, with typical values for the third heating wavelength $\lambda_{3H}$ in this case being, in dependence on the thickness of the substrate 2, between approximately 3500 nm and approximately 3700 nm. With a specified thickness of the substrate 2, it is possible to ascertain the optimum heating wavelength on the basis of a wavelength-dependent transmission curve for the material of the substrate 2, in the present case ULE®. Similar relationships apply to a substrate 2 made of a different material, such as for example Zerodur®. The reflectance $R_{3H}$ of the reflective layer 3d is maximum, or has a maximum, within the above-stated wavelength range.

In the example shown in FIG. 3A, the second coating 4 has an anti-reflection layer 4b, which, in addition to suppressing the reflection of the heating radiation 9 at the first heating wavelength $\lambda_{1H}$ and to suppressing the reflection of the heating radiation 11 at the second heating wavelength $\lambda_{2H}$, is also configured for suppressing the reflection of the heating radiation 13 at the third heating wavelength $\lambda_{3H}$. The anti-reflection layer 4b typically has a local maximum of the suppression of the reflection or a minimum reflectance at the respective heating wavelength $\lambda_{1H}$, $\lambda_{2H}$, $\lambda_{3H}$.

Whereas in the examples shown in FIGS. 2A, 2B and FIG. 3A the heating radiation 9, 11, 13 is aligned substantially perpendicular to the bottom side 2b of the substrate 2, in the example shown in FIG. 3B, the heating radiation 13 at the third heating wavelength $\lambda_{3H}$ is aligned with an angle α with respect to the surface normal of the bottom side 2b of the substrate 2, which is typically no more than approximately 10°. In order to align the heating radiation 13 under the angle α, the third heating light source 12 can be positioned on the heat sink 21 such that it is, if appropriate, suitably tilted, and/or the emission characteristic thereof can be appropriately set. As is likewise seen in FIG. 3B, the third heating light source 12, which can be configured, for example, as a laser diode, generates linearly polarized heating radiation 13 which, in the example shown in FIG. 3B, has a first polarization state (s-polarization) with respect to an XZ plane, which corresponds to the drawing plane, of an XYZ coordinate system.

In the example shown in FIG. 3B, the second coating 4 has a polarization-selective layer 4a", which transmits the s-polarized heating radiation 13 at the third heating wavelength $\lambda_{3H}$, with the result that it passes through the substrate 2 and is reflected back at the layer 3d, which reflects the heating radiation 13, of the first coating 3. Arranged between the upper side 2a of the substrate 2 and the layer 3d, which reflects the heating radiation 13, a polarization-changing layer 3e is arranged in FIG. 3B, through which the heating radiation 13 at the third heating wavelength $\lambda_{3H}$ passes twice, and which effects a rotation of the polarization direction of the heating radiation 13 by 90° such that the reflected heating radiation 13 is p-polarized. The p-polarized heating radiation 13 is incident on the polarization-selective layer 4a" of the second coating 4, and is reflected thereby back into the volume of the substrate 2.

The EUV mirror 1, shown in FIG. 3C, differs from the EUV mirror 1, shown in FIG. 3B, merely in that the second coating 4 rather than the first coating 3 is provided with a polarization-changing layer 4c. The s-polarized heating radiation 13 passes through the polarization-changing layer 4c and is circularly polarized thereby before the heating radiation 13 enters the substrate 2. The circularly polarized heating radiation 13, which is reflected back at the reflective layer 3d, is again incident on the polarization-changing layer 4c and is converted into p-polarized heating radiation 13. The p-polarized heating radiation 13 is incident on the polarization-selective layer 4a", and is reflected thereby back into the substrate 2.

In the examples shown in FIG. 3B and FIG. 3C, the third heating wavelength $\lambda_{3H}$ is selected such that it is absorbed only slightly by the substrate 2, i.e. it is typically between approximately 400 nm and approximately 2300 nm. As can be seen in FIGS. 3A-3C, the entire second coating 4 is configured to be transmissive for the heating radiation 13 at the third heating wavelength $\lambda_{3H}$ and for the heating radiation 11 at the second heating wavelength $\lambda_{2H}$. The polarization-selective layer 4a" is here configured to absorb the heating radiation 9 at the first heating wavelength $\lambda_{1H}$ in order to heat the substrate 2 in the region of the bottom side 2b thereof.

In the devices 20, which are described further above in connection with FIGS. 2A, 2B and FIGS. 3A-3C, in each case only a first, second or third heating light source 8, 10, 12 for generating heating radiation 9, 11, 13 at a respective heating wavelength $\lambda_{1H}$, $\lambda_{2H}$, $\lambda_{3H}$ is shown. However, typically a plurality of first, second or third heating light sources 8, 10, 12 are arranged on the heat sink 21 in a grid-type arrangement (matrix) so as to achieve thermal influencing of the EUV mirror with a desired spatial resolution. The heating radiation 8, 10, 12, generated by a heating light source, can be substantially monochromatic, i.e. the radiation intensity is concentrated around the maximum at the heating wavelength, as is the case for example in laser diodes or LEDs. Alternatively, it is also possible to use heating light sources which emit heating radiation in a comparatively broadband wavelength range, wherein the desired heating wavelength or a narrow-band heating wavelength range is selected by suitable wavelength-selective filters.

As an alternative to the devices 20, which are shown further above in connection with FIG. 1 to FIGS. 3A-3C, the first, second and/or third heating light sources 8, 10, 12 can be arranged at a distance from the heat sink 21 and be supplied to the EUV mirror 1 by way of beam guide devices, for example in the form of fibre-optic cables. In order to align the heating radiation 9, 11, 13 in this case with the substrate 2, it is possible for deflection devices to be attached to the heat sink 21, for example, which deflect the heating radiation 9, 11, 13, which exits the fibre-optic cables, in the direction of the bottom side 2b of the substrate 2.

Figure 4:
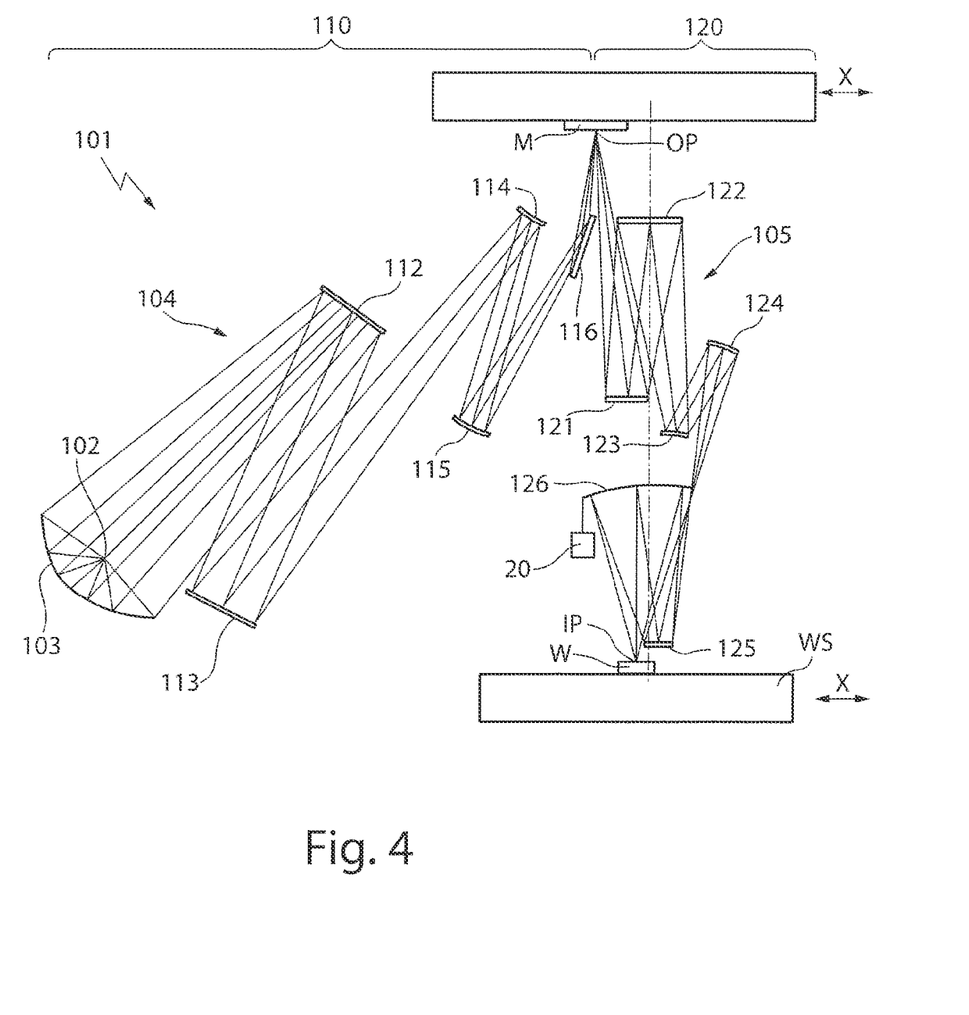
FIG. 4 shows a schematic illustration of an EUV lithography apparatus.

FIG. 4 shows, in a highly schematic fashion, an optical arrangement in the form of an EUV lithography apparatus 101, in which the EUV mirrors 1 of FIG. 1, FIGS. 2A, 2B or of FIGS. 3A-3C can be integrated. The EUV lithography apparatus 101 has an EUV light source 102 for generating EUV radiation, which has a high energy density in an EUV wavelength range below 50 nm, in particular between about 5 nm and about 15 nm. The EUV light source 102 may for example take the form of a plasma light source for generating a laser-induced plasma or be formed as a synchrotron radiation source. In particular in the former case, a collector mirror 103 may be used, as shown in FIG. 4, in order to focus the EUV radiation of the EUV light source 102 into an illumination beam 104 and in this way increase the energy density further. The illumination beam 104 serves for the illumination of a structured object M via an illumination system 110, which in the present example has five reflective optical elements 112 to 116 (mirrors).

The structured object M may be for example a reflective mask, which has reflective and non-reflective, or at least much less reflective, regions for producing at least one structure on the object M. Alternatively, the structured object M may be a plurality of micro-mirrors, which are arranged in a one-dimensional or multi-dimensional arrangement and which are possibly movable about at least one axis, in order to set the angle of incidence of the EUV radiation 104 on the respective mirror.

The structured object M reflects part of the illumination beam 104 and forms a projection beam path 105, which carries the information about the structure of the structured object M and is radiated into a projection lens 120, which produces a projected image of the structured object M or of a respective partial region thereof on a substrate W. The substrate W, for example a wafer, includes a semiconductor material, for example silicon, and is arranged on a mounting, which is also referred to as a wafer stage WS.

In the present example, the projection lens 120 has six reflective optical elements 121 to 126 (mirrors) in order to produce an image of the structure that is present on the structured object M on the wafer W. The number of mirrors in a projection lens 120 typically lies between four and eight; however, only two mirrors may also possibly be used.

In order to achieve a high imaging quality in the imaging of a respective object point OP of the structured object M onto a respective image point IP on the wafer W, highest desired properties are imposed on the surface form of the mirrors 121 to 126; and the position or the alignment of the mirrors 121 to 126 in relation to one another and in relation to the object M and the substrate W also involves precision in the nanometre range. Each of the EUV mirrors 121 to 126 can be configured as described further above in connection with FIG. 1, FIGS. 2A, 2B and FIGS. 3A-3C, and a dedicated device 20 for thermal manipulation, which can be configured as described above, for example, can be assigned thereto.

In the projection lens 120, illustrated in FIG. 4, the sixth mirror 126 is configured in the form of a thermally influenceable EUV mirror 1 according to FIG. 3A, and a device 21 for thermal manipulation is assigned thereto, which is configured to individually drive the heating light sources 8, 10, 12 (not shown in FIG. 4) to set a desired, typically homogeneous temperature distribution in the EUV mirror 126 and to thus avoid undesired deformations and resulting undesired aberrations on the optical surface 6 (cf. FIG. 3A) of the sixth EUV mirror 126.

It is additionally possible for one or more sensors for capturing the temperature of the EUV mirror 126 or of the optical surface 6 and/or the temperature of the substrate 2 of the EUV mirror 126 to be arranged in the EUV lithography apparatus 101, so that the device 20 for thermal influencing can effect regulation of a location-dependent heat introduction into the EUV mirror 126 in order to produce in a targeted fashion a desired location- and time-dependent heat introduction in the EUV mirror 126, with the result that the temperature distribution of the EUV mirror 126 is homogenized.

Additionally or alternatively, it is also possible for the EUV mask 130 to be thermally influenced by way of a device 20, as is illustrated in FIGS. 2A, 2B or in FIGS. 3A-3C. The EUV mask 130 in this case is constructed like the EUV mirrors 1, which are described further above, wherein partial regions in the form of an absorber material, which do not or only slightly reflect the incident EUV radiation 5, are formed additionally on the upper side of the EUV coating 3. The absorbing partial regions together with the reflective partial regions form the structure of the EUV mask 130 to be imaged.

It is to be understood that the EUV mirrors 1, described further above, or the devices 20 for thermal influencing, can also be advantageously used in other optical systems for the EUV wavelength range, for example in inspection systems for EUV masks.

What is claimed is:

1. An optical element, comprising:
a substrate having first and second sides;
a first coating supported by the first side of the substrate; and
a second coating supported by the second side of the substrate,
wherein:
the substrate comprises a glass;
the first coating reflects EUV radiation;
the second coating comprises:
an absorbing layer that absorbs radiation having a wavelength in a range selected from the group consisting of the visible range and the infrared range; and
an anti-reflecting layer that suppresses reflection of radiation at the wavelength,
the absorbing layer is between the substrate and the anti-reflection layer; and
the optical element is an EUV mirror.
2. The optical element of claim 1, wherein a maximum absorbance of the absorbing layer is at wavelengths of more than 1500 nm.
3. The optical element of claim 1, wherein a maximum suppression of the anti-reflection layer is at wavelengths of more than 1500 nm.
4. The optical element of claim 2, wherein a maximum suppression of the anti-reflection layer is at wavelengths of more than 1500 nm.
5. The optical element of claim 1, wherein the substrate comprises a material that is at least partially absorbent for radiation at the wavelength.
6. The optical element of claim 1, wherein the glass comprises a silicate glass.
7. The optical element of claim 1, wherein the glass comprises a quartz glass.
8. The optical element of claim 1, wherein the glass comprises a $TiO_2$-doped quartz glass.
9. The optical element of claim 1, wherein the glass comprises a glass ceramic.
10. The optical element of claim 1, wherein the substrate comprises a material that is at least partially absorbent for radiation at the wavelength, and a maximum absorbance of the absorbing layer is at wavelengths of more than 1500 nm.
11. The optical element of claim 10, wherein a maximum suppression of the anti-reflection layer is at wavelengths of more than 1500 nm.
12. The optical element of claim 11, wherein the glass comprises a glass selected from the group consisting of a silicate glass, a quartz glass and a glass ceramic.
13. The optical element of claim 10, wherein the glass comprises glass selected from the group consisting of a silicate glass, a quartz glass and a glass ceramic.
14. The optical element of claim 1, wherein the substrate comprises a material that is at least partially absorbent for radiation at the wavelength, and the glass comprises a glass selected from the group consisting of a silicate glass, a quartz glass and a glass ceramic.
15. The optical element of claim 14, wherein a maximum suppression of the anti-reflection layer is at wavelengths of more than 1500 nm.
16. The optical element of claim 1, wherein:
a maximum absorbance of the absorbing layer is at wavelengths of more than 1500 nm;
a maximum suppression of the anti-reflection layer is at wavelengths of more than 1500 nm; and
the glass comprises a glass selected from the group consisting of a silicate glass, a quartz glass and a glass ceramic.
17. An arrangement, comprising:
an optical element according to claim 1; and
a light source configured to generate radiation at a wavelength in a range selected from the group consisting of visible radiation and infrared radiation,
wherein the second coating is between the light source and the substrate.
18. The arrangement of claim 17, wherein:
the arrangement comprises a plurality of light sources in a grid-type arrangement; and
for each light source, the second coating is between the light source and the substrate.
19. The arrangement of claim 18, wherein the arrangement is an EUV lithography apparatus.
20. The arrangement of claim 17, wherein the arrangement is an EUV lithography apparatus.

* * * * *

UNITED STATES PATENT AND TRADEMARK OFFICE
CERTIFICATE OF CORRECTION

PATENT NO. : 12,025,818 B2
APPLICATION NO. : 17/393551
DATED : July 2, 2024
INVENTOR(S) : Boris Bittner et al.

It is certified that error appears in the above-identified patent and that said Letters Patent is hereby corrected as shown below:

In the Specification

Column 10, Line 11, please replace "km" with -- $\lambda_{1H}$ --.

Column 10, Line 21, please replace "Aix" with -- $A_{1H}$ --.

Column 11, Line 34, please replace "$T_{1H}$" with -- $T_{1H}$, --.

Signed and Sealed this
Twenty-sixth Day of November, 2024

Katherine Kelly Vidal
*Director of the United States Patent and Trademark Office*